(12) United States Patent
Liu et al.

(10) Patent No.: US 6,575,820 B2
(45) Date of Patent: Jun. 10, 2003

(54) CHEMICAL MECHANICAL POLISHING APPARATUS

(75) Inventors: Li-Chung Liu, Taichung (TW); Ching-Hung Chang, Ta-Li (TW); Chung-Min Lin, Taipei (TW)

(73) Assignee: Nanya Technology Corporation, Kueishan (TW)

( * ) Notice: Subject to any disclaimer, the term of this patent is extended or adjusted under 35 U.S.C. 154(b) by 0 days.

(21) Appl. No.: 10/053,164

(22) Filed: Jan. 15, 2002

(65) Prior Publication Data

US 2002/0173254 A1 Nov. 21, 2002

(30) Foreign Application Priority Data

Mar. 28, 2001 (TW) .......................................... 090107304

(51) Int. Cl.[7] .............................................. B24B 21/18
(52) U.S. Cl. ......................... 451/443; 451/444; 451/56
(58) Field of Search .......................... 451/56, 444, 443, 451/41, 285, 287

(56) References Cited

U.S. PATENT DOCUMENTS

| | | | | |
|---|---|---|---|---|
| 5,961,377 A | * | 10/1999 | Jeong | 451/56 |
| 6,126,530 A | * | 10/2000 | Hirata | 451/444 |
| 6,241,588 B1 | * | 6/2001 | Brown et al. | 451/56 |
| 6,343,977 B1 | * | 2/2002 | Peng et al. | 451/56 |

* cited by examiner

Primary Examiner—Eileen P. Morgan
(74) Attorney, Agent, or Firm—Ladas & Parry

(57) ABSTRACT

A chemical mechanical polishing apparatus comprises a platen having a polishing pad thereon, a wafer carrier holding a wafer on the polishing pad, a washer having a cleaning device; and a dresser. The dresser comprises a bottom disk contacting the polishing pad. The dresser can move between the polishing pad and the washer. When the dresser moves into the washer, a diamond zone on the bottom disk cleans the polishing pad, and the cleaning device cleans the diamond zone.

7 Claims, 8 Drawing Sheets

CHEMICAL MECHANICAL POLISHING APPARATUS

BACKGROUND OF THE INVENTION

1. Field of the Invention

The present invention relates in general to a chemical mechanical polishing (CMP) apparatus. In particular, the present invention relates to a washer for the CMP apparatus.

2. Description of the Related Art

A process commonly used in fabrication of integrated circuits to create a planar topography is chemical mechanical polishing (CMP) process. This process involves chemically removing a surface while also mechanically grinding or polishing it. The combined action of surface chemical reaction and mechanical polishing allows for a controlled, layer by layer removal of a desired material from the wafer surface, resulting in a preferential removal of protruding surface topography and a planarized wafer surface.

However, if the CMP process is out of control, the wafer's surface becomes non-uniform. For an etching process, if contact windows or via holes are formed on a substrate with a non-uniform level, the endpoint of the etching process is not easy to maintain. Some contact windows or via holes may be overetched; some contact windows or via holes may not reach the predetermined depth and thereby experience open circuits. For a lithography process, the accuracy of the exposure is easily lost. With the increase of integration, elements are shrunk and it is important to smooth the substrate surface to a uniform level.

FIG. 1 schematically illustrates a conventional CMP apparatus 100 with a platen 110, a dresser 120, a wafer carrier 150, and a washer 160.

Referring to FIG. 2, a polishing pad 112 of polyester is positioned on the platen 110, and a slurry is positioned on the polishing pad 112. The wafer carrier 150 includes a guide ring 152, a top ring 154 and a backing ring 156. The top ring 154 is supported on the backing ring 156. The guide ring 152 is positioned on the outer periphery of the top ring 154 to surround wafer 102 so that the wafer 102 is not disengaged from the wafer carrier 150. The wafer is polished while being pressed between the wafer carrier 150 and the platen 110.

After polishing, the polishing pad 112 is washed by the dresser 120. However, some residue, from the reactant of the slurry and the removed surface layer, still remains on the polishing pad 112. If the residue is not removed, it can damage the resulting polished wafer.

FIG. 3 shows the top view of the CMP apparatus. After removing the wafer 102 from the platen 110 by the wafer carrier 150, the dresser 120 is moved on the platen 110 and the polishing pad 112 is cleaned by clockwise or counterclockwise action of the dresser 120. The residue in the polishing pad 112 is scraped by the dresser 120 every one or several turns of the CMP process. The dresser 120 is then washed by immersion in the washer 160 filled with water to remove the residue attached to a bottom disk 125 of the dresser 120. The dresser 120 rotates in the washer 160 to make water flow. The flowing water removes the residue.

However, using the flowing water to remove all of the residue is difficult. Conventionally, the bottom disk 125 is frequently changed by shutting down the CMP apparatus, to prevent the residue from damaging the wafers.

SUMMARY OF THE INVENTION

The present invention provides a CMP apparatus comprising a platen, a wafer carrier, a washer with a cleaning device, and a dresser. A polishing pad is disposed on the platen. The wafer carrier holds a wafer on the polishing pad, and the wafer carrier can move on to and off of the polishing pad. The dresser has a bottom disk contacting the polishing pad, and can move between the polishing pad and the washer. A diamond zone disposed on the bottom disk can clean the polishing pad, and the cleaning device can clean the diamond zone.

The cleaning device can be at least one scrubber disposed in the lower part of the washer, or an ultrasonic device, or combination thereof.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

The present invention provides a washer 160 for the dresser 120 of CMP apparatus 100. The dresser 120 is used to scrape the residue from the polishing pad 112. The dresser 120 can be a brush or diamond disk. In this embodiment, the dresser 120 uses diamond disk as an example.

Figure 1:
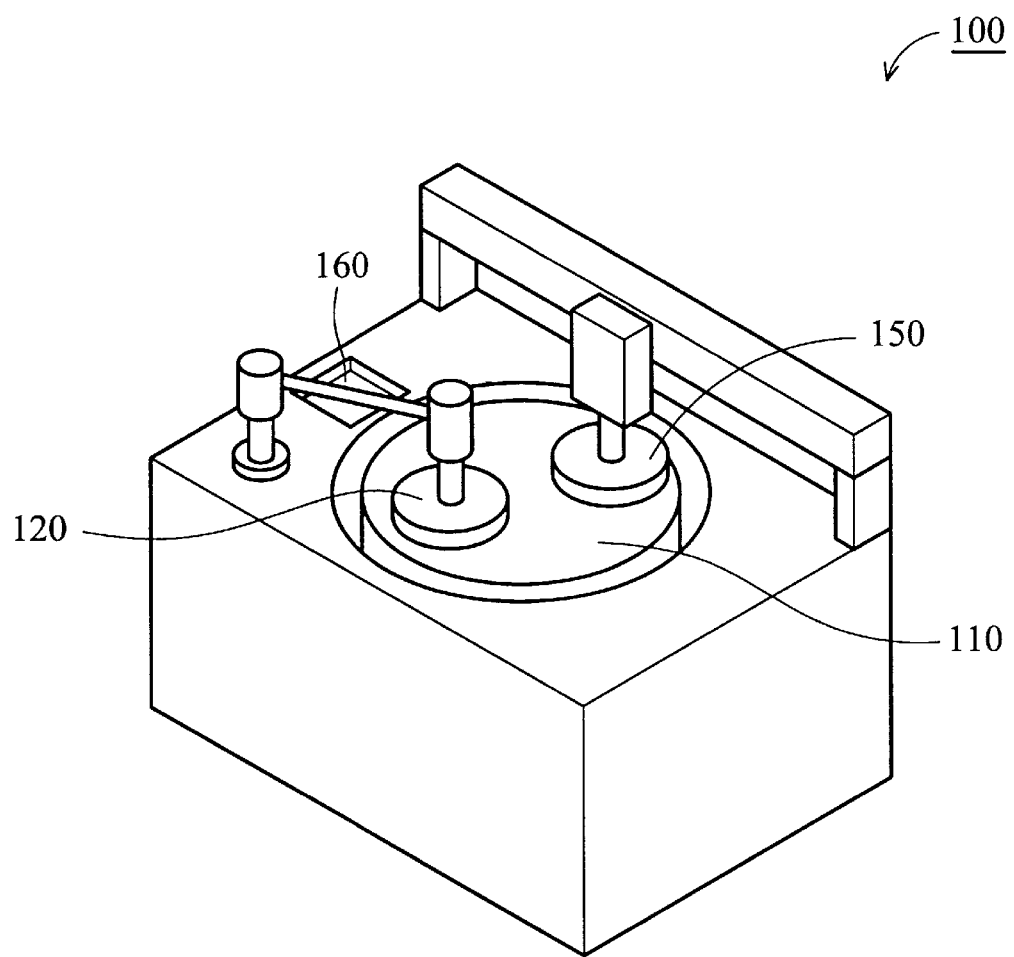
FIG. 1 is a CMP apparatus according to the prior art.
Figure 2:
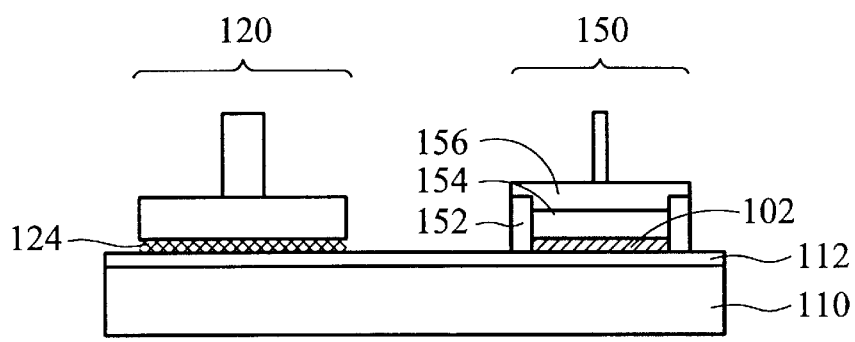
FIG. 2 is a lateral view of the CMP apparatus of FIG. 1.
Figure 3:
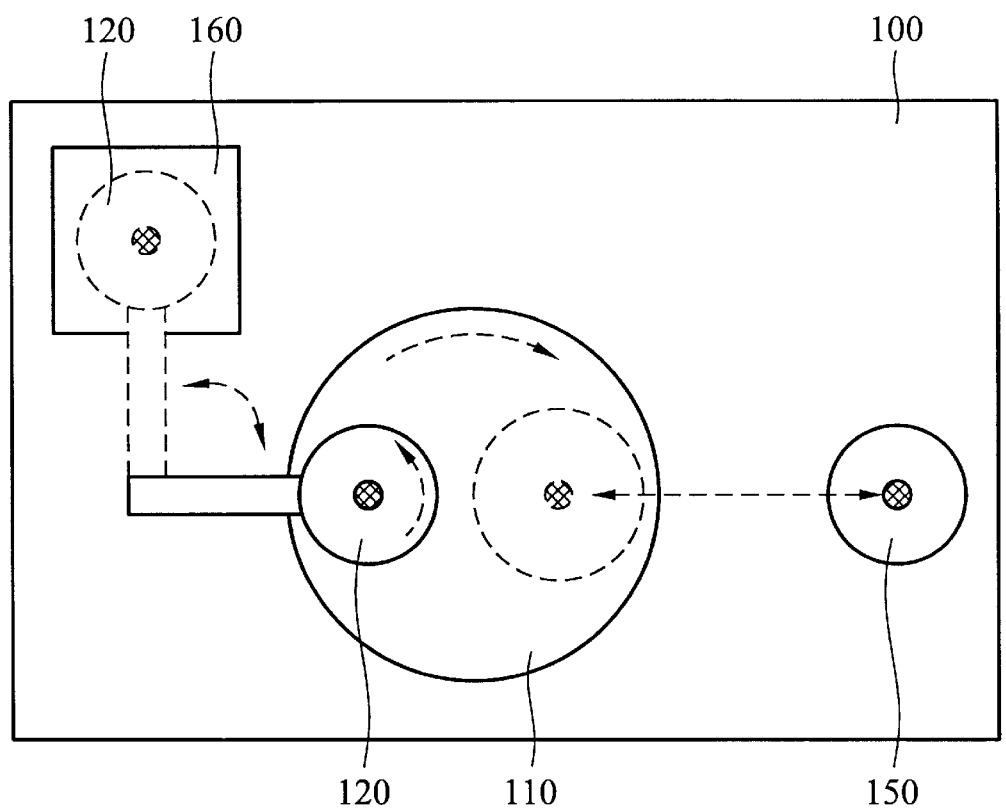
FIG. 3 is a top view of the CMP apparatus of FIG. 1.
Figure 4A:
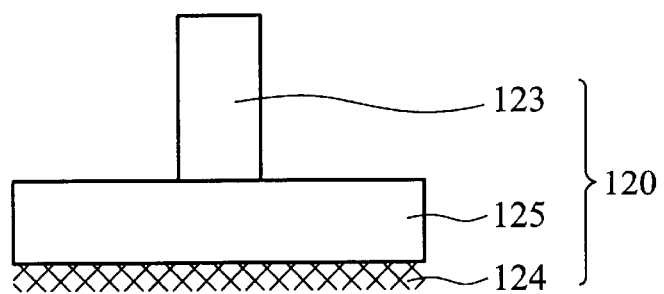
FIG. 4($a$) is a lateral view of a dresser according to the prior art, and FIGS. 4($b$) and ($c$) are top views of the dresser.
Figure 4B:
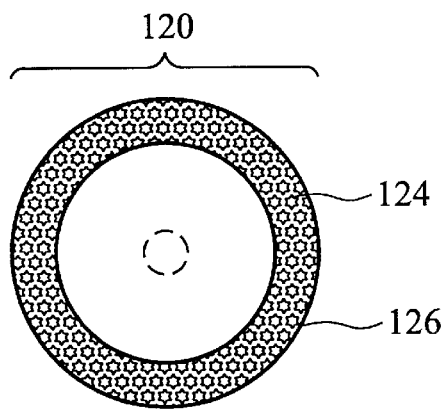
Figure 4C:
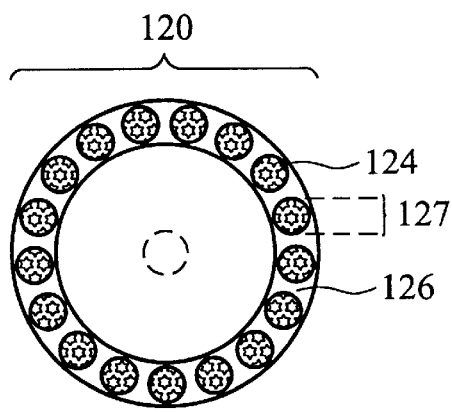

Referring to FIG. 4($a$), the dresser 120 comprises the bottom disk 125 and the revolving spindle 123 connecting to the bottom disk 125. The bottom disk 125 and the revolving spindle 123 are metal. The surface of the bottom disk 125 is treated by special technique and embedded with diamonds. The bottom disk 125 has two types, one is shown in FIG. 4($b$), the outside lane is a diamond zone 126 uniformly embedded with a plurality of diamonds 124. Another bottom disk 125 is shown in FIG. 4($c$), the outside lane a diamond zone 126 with several diamond dishes 127. The diamond dishes 127 are detachable, and embedded with 10~30 diamonds. The diameter of these diamonds 124, no matter which type, is about 50~200 $\mu$m. The density of these diamonds 124 is about 2~100 pcs/mm$^2$.

Figure 5:
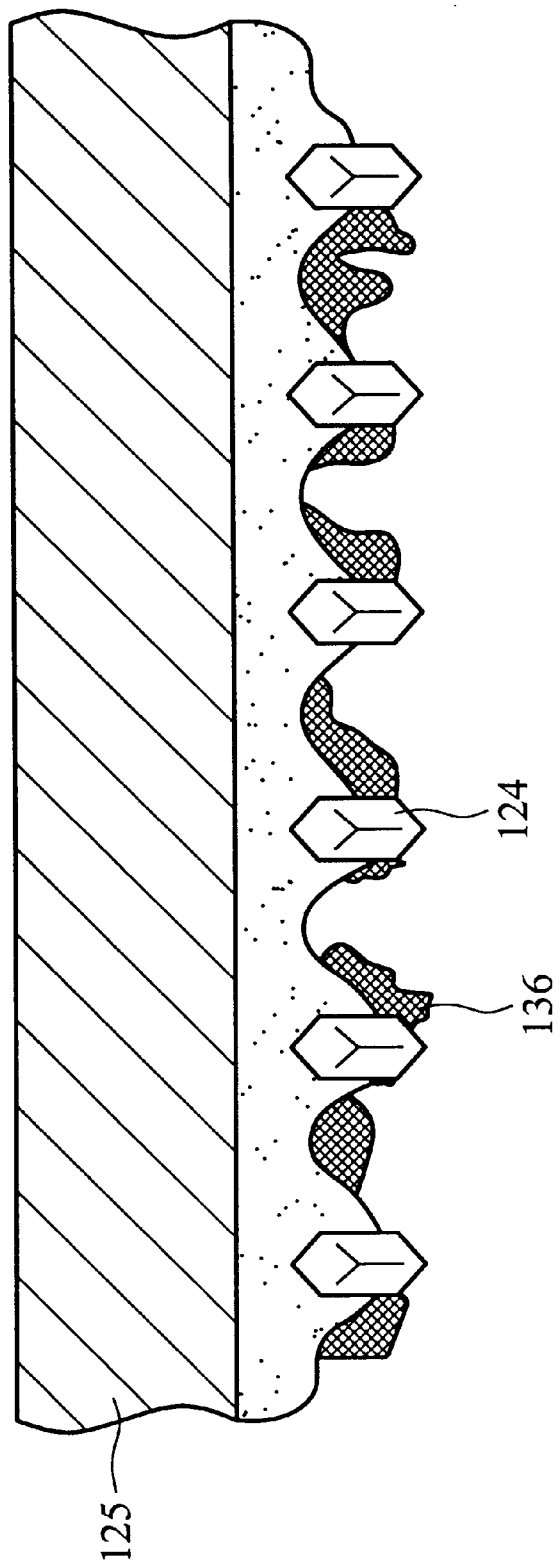
FIG. 5 shows the bottom disk and the embedded diamonds of the dresser, and some residue remaining in the space between the diamonds.

FIG. 5 shows the bottom disk 125 and the embedded diamonds 124 of the dresser 120. After cleaning the polishing pad 112, some residue 136 remains in the space between the diamonds 124. It is difficult to remove the residue 136, especially by the dresser 120. If the residue 136 remaining in the space between the diamonds 124 is not removed, the cleaning efficiency of the dresser 120 is reduced. Residue 136 remaining in the polishing pad 112 contaminates the wafer to be polished.

FIG. 6 shows a washer 160 according to the first embodiment of the present invention. As shown in FIG. 6($a$), a scrubber 130 is disposed in the lower part of the washer 160. The length and width of the scrubber 130 must cover the width of the diamond zone 126 in the bottom disk 125 of the dresser 120. When the dresser spins, the scrubber 130 cleans the whole diamond zone 126. Therefore, the size of the scrubber 130 depends on the size of the bottom disk 125 and the width of the diamond zone 126.

Figure 6A:
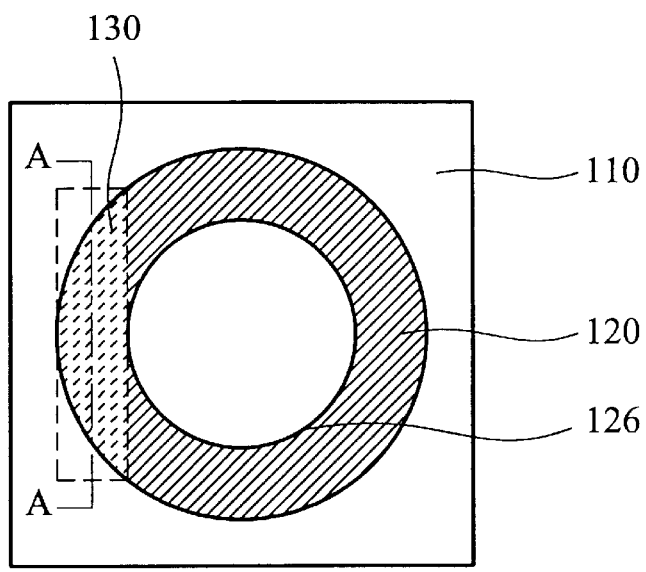
FIGS. 6($a$)–6($c$) show a washer according to the first embodiment of the present invention.
Figure 6B:
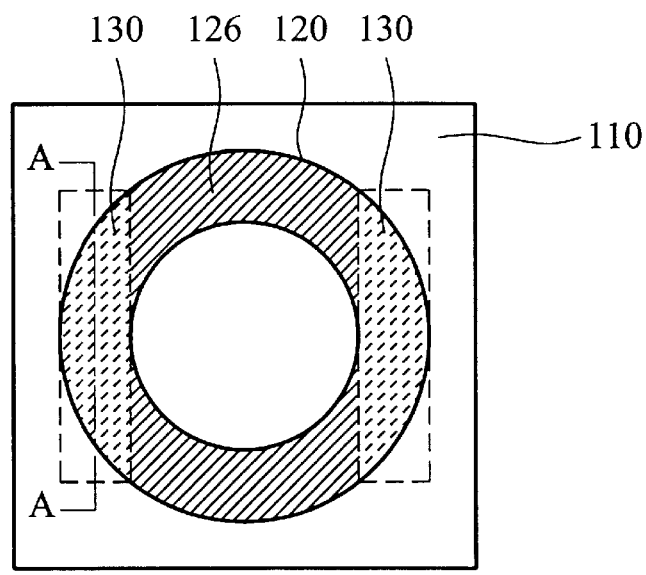

As shown in FIG. 6(b), two scrubbers 130 are set in the lower part and at two sides of the washer 160 to enhance the cleaning efficiency. The length and the width of these two scrubbers 130 depends on the size of the bottom disk 125 and the width of the diamond zone 126. The number of the scrubbers 130 is not limited to one and two. The number of the scrubbers 130 and the position of the scrubbers 130 can be altered as needed.

Figure 6C:
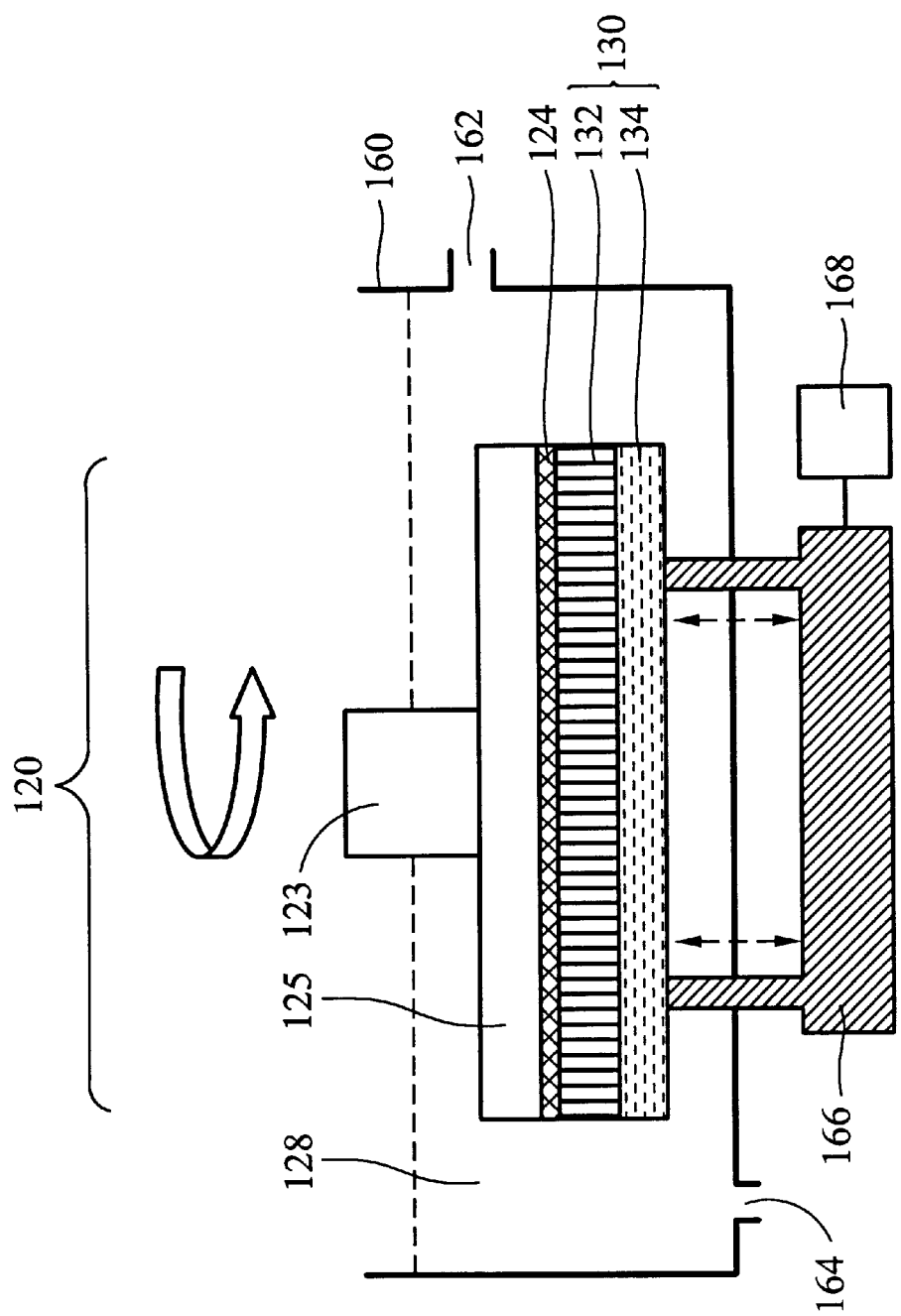

FIG. 6(c) shows a cross-section of A—A line in FIGS. 6(a) and (b). The scrubber 130 comprises a base 134 and brushes 132 fixed at the base 134. The base 134 can be metal. The brushes 132 can be synthetic resin or other soft and elastic materials, which can protect the surface of the dresser 120 and prevent other impurities. The diameter of the brushes 132 is about 20~250 g m. The gap between the brushes 132 is about 0.3~1.5 mm. The length of the brushes 132 must be maintained to contact the space between the diamonds 124. The base 134 of the scrubber 130 connects with a hoist 166. The height of the base 132 is held by the hoist 166 through a controller 168. If the cleaning efficiency for the dresser 120 is not good, the scrubber 130 is lifted by adjusting the controller 168 so as to enhance the pressure of the brushes 132 to the diamond zone 126 by enhancing the contacting length of the brushes 132. If the cleaning efficiency for the dresser 120 is adequate, the scrubber 130 is lowered to reduce the pressure of the brushes 132 to the diamond zone 126, and the lifetime of the brushes 132 is then increased.

A liquid 128 fills the washer 160. The liquid 128 can be water or other solvents. The liquid 128 is injected from an input 162 and discharged through an exhaust. The level of the liquid 128 must maintain a consistent height to stabilize the cleaning efficiency. When the dresser 120 spins in the washer 160, the residue 136 is scraped by the brushes 132 and falls into the liquid 128. The residue 136 is then removed by the flowing liquid 128 through the exhaust 164. The washing time depends on the amount of residue 136 remaining in the diamond zone 126.

Figure 7:
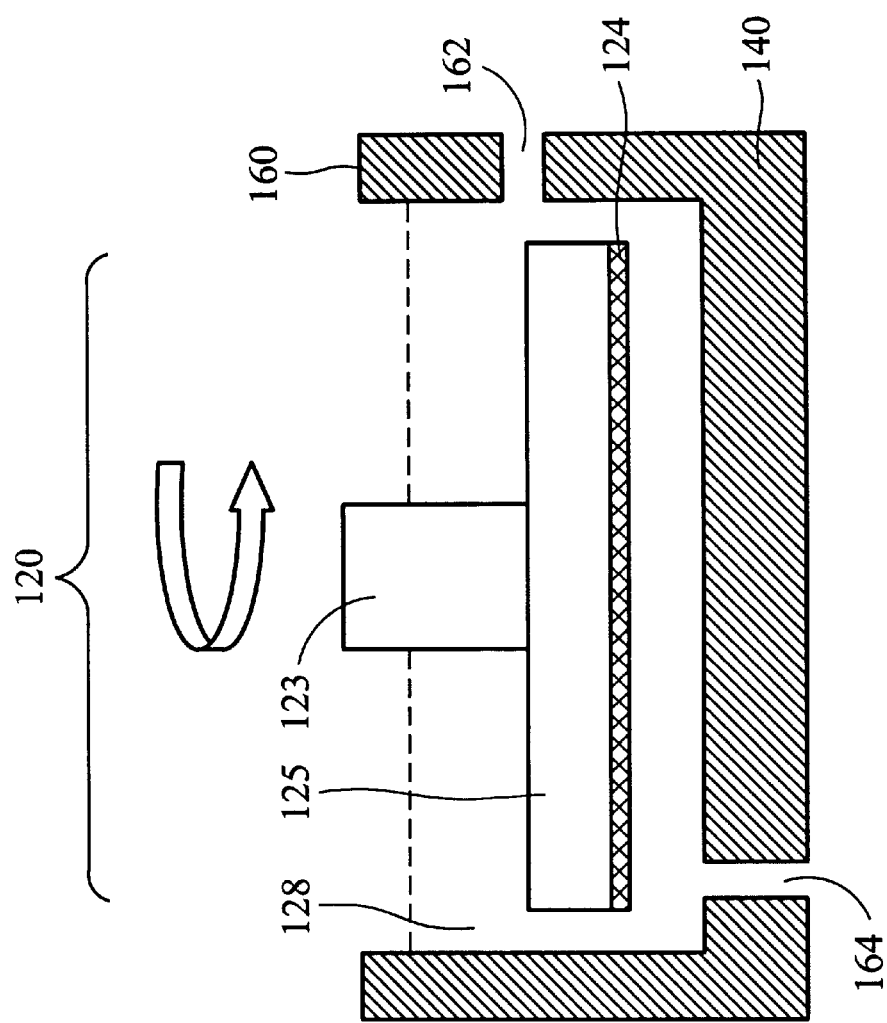
FIG. 7 shows a washer according to the second embodiment of the present invention.

FIG. 7 shows a washer 160 according to the second embodiment of the present invention. An ultrasonic device 140 is set in the washer 160. A liquid 128 fills the washer 160. The liquid 128 can be water or other solvents. The liquid 128 is injected from an input 162 and discharged through an exhaust. The ultrasonic device 140 produces a mass of bubbles to agitate the residue 136 existing in the space between the diamonds 124 of the bottom disk 125 of the dresser 120, and dislodge the residue 136. The residue 136 is then removed by the flowing liquid 128 through the exhaust 164. The level of the liquid 128 must maintain a consistent height to stabilize the cleaning efficiency. The washing time depends on the amount of residue 136 existing in the diamond zone 126, preferably about 10~60 seconds. The ultrasonic device 160 can be used to clean any type of dresser, such as brush type dresser.

Figure 8:
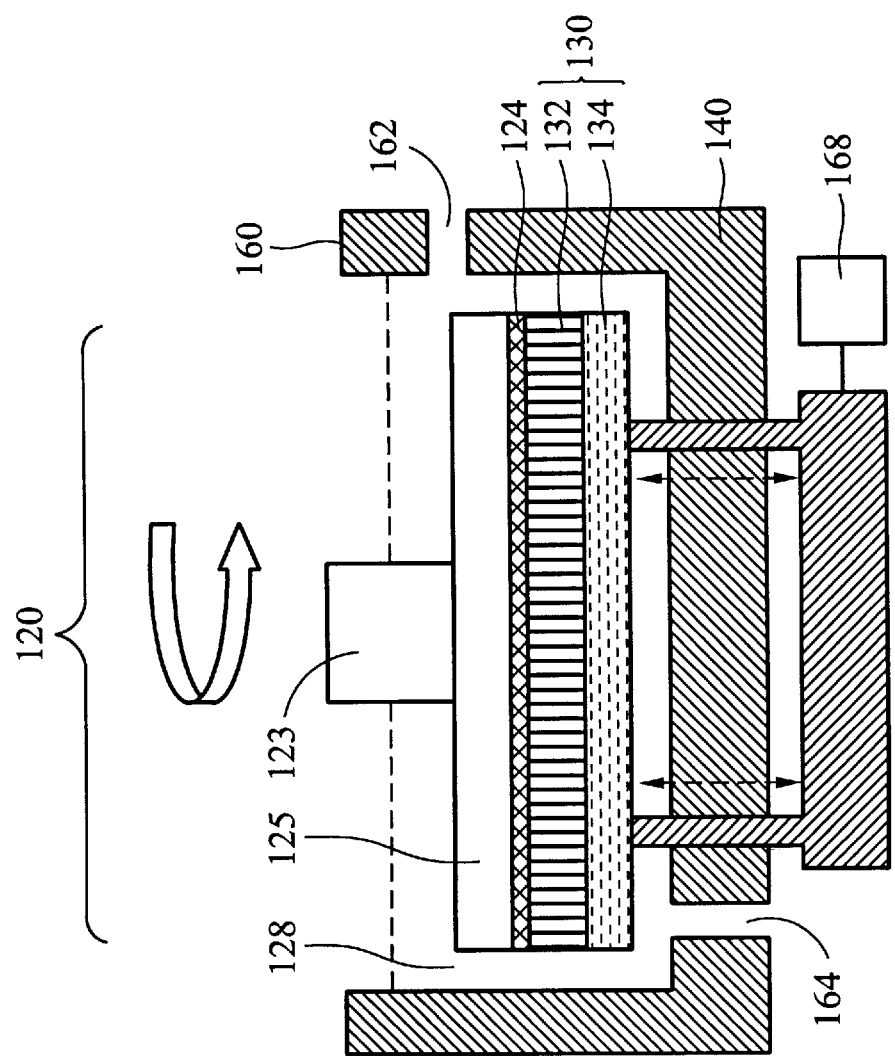
FIG. 8 shows a washer according to the third embodiment of the present invention.

FIG. 8 shows a washer 160 according to the third embodiment of the present invention. A scrubber 130 is disposed in the lower part of the washer 160. The length and width of the scrubber 130 must cover the width of the diamond zone 126 in the bottom disk 125 of the dresser 120. When the dresser spins, the scrubber 130 cleans the whole diamond zone 126. The base 134 of the scrubber 130 connects to a hoist 166. The height of the base 132 is maintained by the hoist 166 through a controller 168. If the cleaning efficiency for the dresser 120 is inadequate, the scrubber 130 is lifted by adjusting the controller 168 so as to enhance the pressure of the brushes 132 on the diamond zone 126 by enhancing the contact length of the brushes 132. If the cleaning efficiency for the dresser 120 is adequate, the scrubber 130 is lowered to reduce the pressure of the brushes 132 on the diamond zone 126, and the lifetime of the brushes 132 is then increased.

In the third embodiment, not only the scrubber 130, but also the ultrasonic device 140, is used to clean the dresser 120. The ultrasonic device 140 produces a mass of bubbles to agitate the residue 136 existing in the space between the diamonds 124 of the bottom disk 125 of the dresser 120, and dislodge the residue 136. The residue 136 is then removed by the flowing liquid 128 through the exhaust 164.

The residue 136 is scraped by the scrubber 130 and agitated by the ultrasonic device 140 at the same time to thoroughly clean the bottom disk 125 of the dresser 120.

A liquid 128 fills the washer 160. The liquid 128 can be water or other solvents. The liquid 128 is injected from an input 162 and discharged through an exhaust 164. The residue 136 is scraped by the scrubber 130 and agitated by the ultrasonic device 140 and falls into the liquid 128. Moreover, residue 136 remaining in the brushes 132 can also be removed by the ultrasonic device 140. The residue 136 is then removed by the flowing liquid 128 through the exhaust 164.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A chemical mechanical polishing apparatus, comprising:

a platen having a polishing pad thereon;
   a wafer carrier for holding a wafer on the polishing pad, wherein the wafer carrier can move on to and off of the polishing pad; a dresser having a bottom disk with a diamond zone for contacting the polishing pad, the dresser moving between the polishing pad and a washer;
   the washer having a cleaning device comprising at least one scrubber disposed in a lower part of the washer and an ultrasonic device, wherein the scrubber scrapes residues existing in the diamond zone and the ultrasonic device agitates and removes residues existing in the diamond zone and on the scrubber; and
   wherein the diamond zone disposed on the bottom disk can clean the polishing pad, and the cleaning device can clean the diamond zone.

2. The CMP apparatus as claimed in claim 1, wherein the scrubber comprises a base and a plurality of brushes fixed on the base, and the top of the brushes contacts the diamond zone.

3. The CMP apparatus as claimed in claim 1, further comprising a hoist connected to the base, wherein the scrubber is lifted by the hoist.

4. The CMP apparatus as claimed in claim 1, wherein the width of the scrubber covers the width of the diamond zone.

5. The CMP apparatus as claimed in claim 1, wherein the brushes is synthetic resin, the diameter of the brushes is 20~250 μm, and the gap between the brushes is 0.3~1.5 mm.

6. A chemical mechanical polishing apparatus, comprising:
   a platen having a polishing pad thereon;
   a wafer carrier holding a wafer on the polishing pad, wherein the wafer carrier moves on to and off of the polishing pad;
   a washer having at least one scrubber disposed in the lower part of the washer, wherein the scrubber comprises a base and a plurality of brushes fixed on the base;
   a dresser having a bottom disk contacting the polishing pad, the dresser moving between the polishing pad and the washer, wherein a diamond zone on the bottom disk cleans the polishing pad, and the scrubber cleans the diamond zone, and
   a hoist connected to the base of the scrubber, wherein the top of the brushes of the scrubber contacts the diamond zone and the scrubber is lifted or lowered by the hoist so as to adjust a cleaning efficiency for the dresser by enhancing or reducing pressure of the brushes on the diamond zone.

7. The CMP apparatus as claimed in claim 6, wherein the washer further has an ultrasonic cleaning device.

* * * * *